United States Patent
Lee et al.

(10) Patent No.: US 8,203,477 B2
(45) Date of Patent: Jun. 19, 2012

(54) ANALOG-TO-DIGITAL CONVERSION AND IMPLEMENTATIONS THEREOF

(75) Inventors: Jeonghwan Lee, Seoul (KR); Gunhee Han, Goyang-si (KR); Kwi Sung Yoo, Seoul (KR); Seog Heon Ham, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 108 days.

(21) Appl. No.: 12/662,449

(22) Filed: Apr. 19, 2010

(65) Prior Publication Data

US 2010/0265114 A1 Oct. 21, 2010

(30) Foreign Application Priority Data

Apr. 20, 2009 (KR) ........................ 10-2009-0034257

(51) Int. Cl.
*H03M 1/56* (2006.01)
(52) U.S. Cl. .......... 341/169; 327/133; 363/89; 323/222; 341/155
(58) Field of Classification Search ........... 341/155–169
See application file for complete search history.

(56) References Cited

U.S. PATENT DOCUMENTS

| 5,066,955 | A | * | 11/1991 | Scheerer et al. | 341/168 |
| 5,347,176 | A | * | 9/1994 | Bloom | 327/133 |
| 5,894,282 | A | * | 4/1999 | Betts et al. | 341/157 |
| 6,670,904 | B1 | | 12/2003 | Yakovlev | |
| 7,148,664 | B2 | * | 12/2006 | Takahashi et al. | 323/222 |
| 7,359,224 | B2 | * | 4/2008 | Li | 363/89 |

FOREIGN PATENT DOCUMENTS

| KR | 2007-0091575 | 9/2007 |
| KR | 2008-0046484 | 5/2008 |
| WO | WO-2008-0026129 | 3/2008 |

* cited by examiner

*Primary Examiner* — Lam T Mai
(74) *Attorney, Agent, or Firm* — Harness, Dickey & Pierce, P.L.C.

(57) ABSTRACT

In one embodiment, an analog-to-digital converter (ADC) includes a comparator and a supply circuit. The comparator is configured to compare an input signal to a reference signal. The supply circuit is configured to supply the reference signal. The supply circuit is configured to provide different circuit configurations for supplying the reference signal during different stages of analog-to-digital conversion such that the reference signal is scaled in substantially a same manner during at least two of the stages.

30 Claims, 17 Drawing Sheets

ANALOG-TO-DIGITAL CONVERSION AND IMPLEMENTATIONS THEREOF

PRIORITY STATEMENT

This application claims the benefit of priority under 35 U.S.C. §119 to Korean Patent Application No. 10-2009-0034257, filed on Apr. 20, 2009, in the Korean Intellectual Property Office, the entire contents of which is incorporated herein by reference

BACKGROUND

1. Field

The present invention relates to analog-to-digital conversion.

2. Description of the Related Art

Many devices produce an analog signal that must then be converted to a digital signal for digital processing. For example, many sensors generate an analog signal that must be converted to digital before being handled by a computer.

As another example, a CMOS image circuit includes an array of pixels that output analog signals. These analog signals are then converted to digital. Many CMOS image sensors use a ramp analog-to-digital converter (ADC), which is essentially a comparator and appropriate control logic. In the conventional ramp ADC, an input voltage of the signal to be converted is compared with a gradually increasing reference voltage. The gradually increasing reference voltage is generated by a digital-to-analog converter ("DAC") as it sequences through and converts digital codes into analog voltages. This gradually increasing reference voltage is known as the ramp voltage. In operation, when the ramp voltage reaches the value of the input voltage, the comparator generates a signal that latches the digital code of the DAC. The latched digital code is used as the output of the ADC.

The problem with the ramp ADC is that it must step through, one value at a time, all possible digital values that could be generated and output by the ADC. For example, if the CMOS sensor has a 12-bit resolution, then a 12-bit ramp ADC must be used to obtain the correct digital output. For a 12-bit ramp ADC there may be 4,096 steps in any single conversion cycle to ensure that the input voltage is converted to the appropriate digital code (one of 4,096 possibilities). This is a very long conversion period, which increases by a factor of two for every additional bit of resolution in the sensor. Since it is desirable to increase the resolution of CMOS image sensors, it is desirable to decrease the number of steps in the analog-to-digital conversion cycle.

Accordingly, a dual ramp ADC has been devised wherein a fine ADC step follows a course ADC step. During the course ADC step, the ramp voltage has a steep slope, and obtains an approximate digital value for the analog signal. For example, the more significant bits are determined. During the fine ADC step, the ramp voltage has a much more gradual slope to permit fine acquisition of the digital representation of the analog signal. Namely, the lower significant bits are determined. Unfortunately, the ramp signals during the course and fine ADC steps are not delivered to the comparator in the same manner. Namely, undesired influences like parasitic capacitance may affect the slope of the ramp signal during the course ADC step and the fine ADC differently. Stated another way, the delivery ratio of the ramp signal during the course ADC step differs from the delivery ratio of the ramp signal during the fine ADC step such that ramp signal is scaled differently during these two steps. As result, the desired changes in the ramp signal during the course and fine ADC steps are not met, and less accurate digital signals may be generated.

SUMMARY

The present invention relates to analog-to-digital conversion.

In one embodiment, an analog-to-digital converter (ADC) includes a comparator and a supply circuit. The comparator is configured to compare an input signal to a reference signal. The supply circuit is configured to supply the reference signal. The supply circuit is configured to provide different circuit configurations for supplying the reference signal during different stages of analog-to-digital conversion such that the reference signal is scaled in substantially a same manner during at least two of the stages.

In one embodiment, the supply circuit is configured to provide the different circuit configurations based on output from the comparator.

In another embodiment, the ADC further includes a control signal generator generating a plurality of control signals. Here, the supply circuit is configured to provide the different circuit configurations based on the plurality of control signals.

In operation, the supply circuit receives a first ramp signal having a first slope during a first stage, has a first circuit configuration during the first stage, and the first circuit configuration generates a first reference signal as the reference signal based on the first ramp signal. Also during operation, the supply circuit receives a second ramp signal having a second slope during a second stage, has a second circuit configuration during the second stage, and the second circuit configuration generates a second reference signal as the reference signal based on the second ramp signal. The first slope is greater than the second slope.

In a further embodiment, the supply circuit is configured to store the first reference signal based on output from the comparator prior to the second stage. In this embodiment the supply circuit is configured to achieve at least a third circuit configuration to store the first reference signals based on output from the comparator prior to the second stage. Here, the first and second circuit configurations are a same circuit configuration, and the third circuit configuration differs from the first and second circuit configurations.

Another embodiment of the ADC includes a comparator and a supply circuit. The comparator is configured to compare an input signal to a reference signal. The supply circuit is configured to supply the reference signal based on a first ramp signal having a first slope during a first ADC stage and configured to supply the reference signal based on a second ramp signal having a second slope during a second ADC stage. The supply circuit is configured to adjust the first and second slopes of the first and second ramp signals, respectively, in supplying the first and second reference signals, and the adjustment to the first and second slopes is by a substantially same ratio.

A further embodiment includes an ADC configured to perform a conversion process that includes at least a first step and a second step. The first step is performed based on a first ramp signal having a first slope, and the second step is performed based on a second ramp signal having a second slope. A compensating circuit is configured to compensate the ADC to reduce a difference between a first ratio by which the first slope is adjusted and a second ratio by which the second slope is adjusted.

The present invention also relates to an image sensor.

In one embodiment, the image sensor a pixel unit array, a row decoder configured to selectively enabling output of a row of pixel units in the pixel unit array, and a processing circuit configured to process output from each pixel unit in the enabled row of pixel units. The processing circuit may include an analog-to-digital converter according to any of the above-described embodiments.

The present invention still further relates to an image processing system.

In one embodiment, the image processing system includes an image sensor according to one of the above described embodiments, and/or an analog-to-digital converter according to any of the above-described embodiments.

The present invention also relates to methods of analog-to-digital conversion, image sensing and/or image processing.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Figure 1:
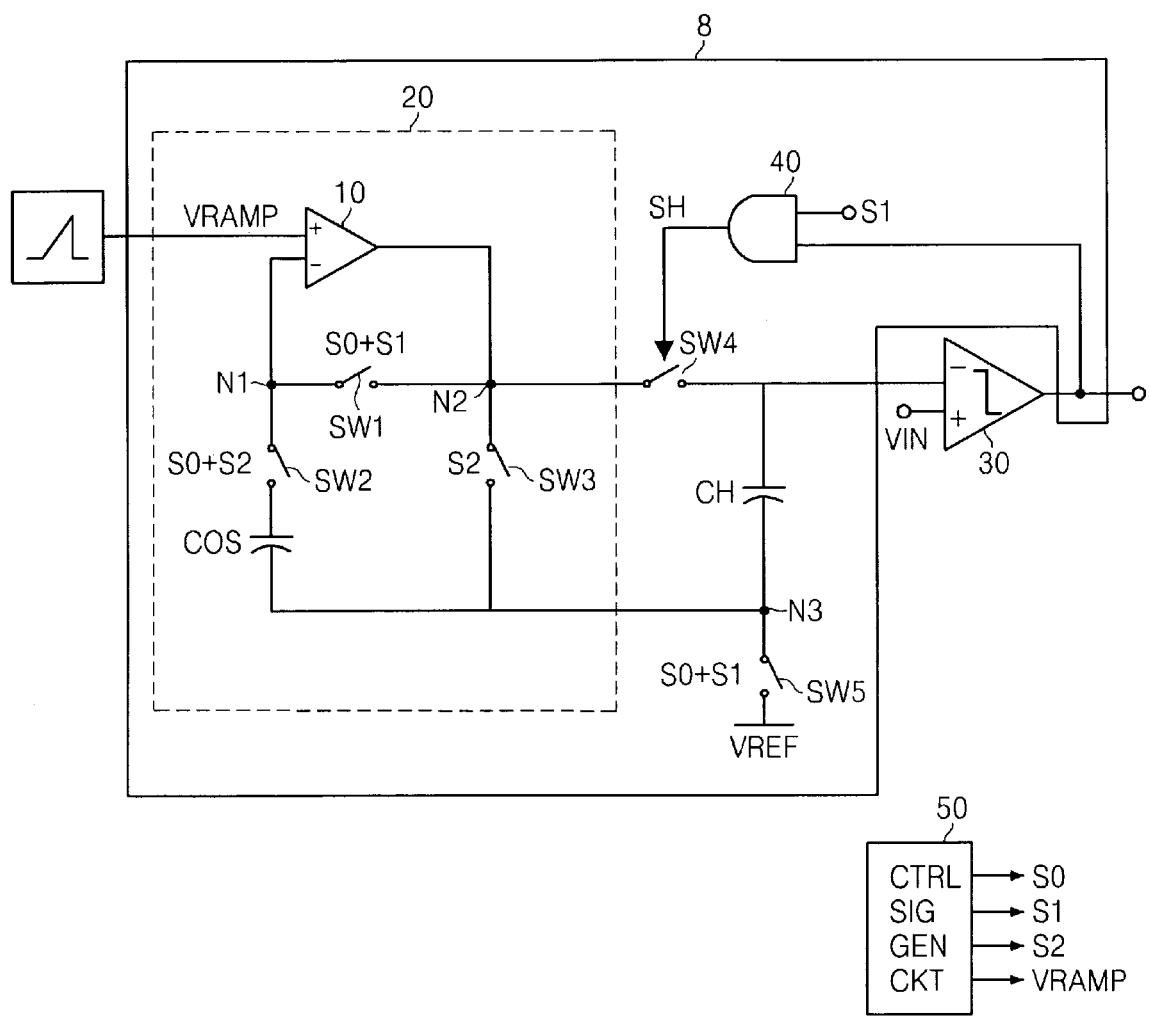
FIG. 1 illustrates an embodiment of an analog-to-digital converter (ADC) according to an embodiment of the present invention.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First Embodiment

FIG. 1 illustrates an analog-to-digital converter (ADC) according to an embodiment of the present invention. As shown, the ADC includes a supply circuit 8. The supply circuit 8 supplies a reference voltage VY to a negative input terminal of an operational amplifier 30. The operational amplifier 30 compares this reference voltage VY to the voltage VIN of an input signal supplied to the positive input terminal.

The supply circuit includes a first differential amplifier 10, first-fifth switches SW1-SW5, first and second capacitors COS and CH, and NAND gate 40. The first differential amplifier 10 receives a ramp voltage VRAMP at a positive terminal, and the negative terminal is connected to a first node N1. The output of the first differential amplifier 10 is supplied to a second node N2. The first node N1 and the second node N2 are selectively connected by a first switch SW1. The first switch SW1 opens or closes based on a first control signal S0 and a second control signal S1. In particular, if either or both of the first and second control signals S0 and S1 are logic high then the first switch SW1 is closed. If both of the first and second control signals S0 and S1 are logic low then the first switch SW1 is open.

A second switch SW2 and a first capacitor COS are connected in series to a third node N3. The second switch SW2 is controlled by the first control signal S0 and a third control signal S2. In particular, the second switch SW2 is closed if either or both of the first control signal S0 and the third control signal S2 are logic high. If both of the first control signal S0 and the third control signal S2 are logic low, then the second switch SW2 is open.

The second node N2 is connected to the third node N3 by a third switch SW3. The third switch SW3 is controlled by the third control signal S2. In particular, if the third control signal S2 is logic high, the third switch SW3 is closed. If the third control signal S2 is logic low, then the third switch SW3 is open.

The second node N2 is connected to a negative terminal of the second operational amplifier 30 by a fourth switch SW4. The fourth switch SW4 is controlled by a fourth control signal SH. If the fourth control signal SH is logic high, then the fourth switch SW4 is closed, and if the fourth control signal SH is logic low, then the fourth switch SW4 is open. A second capacitor CH and a fifth switch SW5 are connected is series between the negative terminal of the second operational amplifier 30 and a reference voltage VREF. The fifth switch SW5 is controlled by the first control signal S0 and the second control signal S1. In particular, the fifth switch SW5 is closed if either or both of the first control signal S0 and the second control signal S1 are logic high. The fifth switch SW5 is open if both of the first control signal S0 and the second control signal S1 are logic low. As shown in FIG. 1, the third node N3 is formed between the second capacitor CH and the fifth switch SW5.

An input signal IN having an input signal voltage VIN is supplied to the positive terminal of the second operational amplifier 30. The output of the second operational amplifier 30 provides the output of the ADC. This output is also connected to one of the two input terminals of an AND gate 40. The AND gate 40 receives the second control signal S1 at its other input. The output of the AND gate is the fourth control signal SH.

The first differential amplifier 10, the first switch SW1, the second switch SW2, the third switch SW3, and the first capacitor COS form a supply circuit 20, the operation of which will be described in greater detail below.

Figure 2:
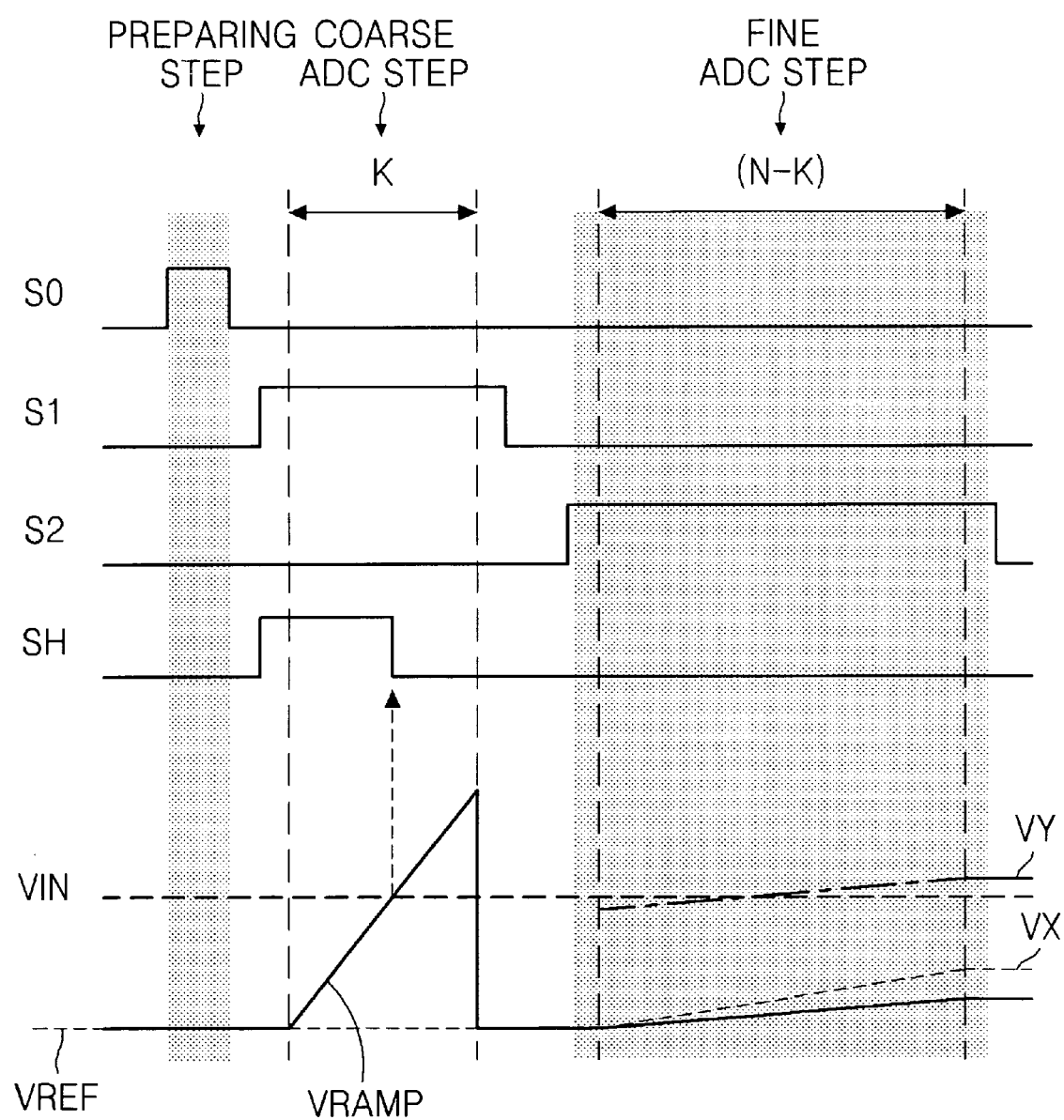
FIG. 2 illustrates waveforms of signals generated during operation of the ADC illustrated in FIG. 1.

As further shown in FIG. 1, a control signal generating circuit 50 generates the first control signal S0, the second control signal S1, the third control signal S2, and the ramp signal VRAMP. FIG. 2 illustrates the first, the second, and the third control signals S0, S1 and S2 and the ramp signal VRAMP generated by the control signal generating circuit 50. In particular, FIG. 2 illustrates the timing with which the control signal generating circuit 50 generates the first, second and third control signals S0, S1 and S2 and the ramp signal VRAMP.

FIG. 2 also shows the fourth control signal SH and an example input signal voltage VIN. These voltages and their timings will be described in greater detail below with respect to the operation of the ADC illustrated in FIG. 1. As illustrated in FIG. 2, operation of the ADC illustrated in FIG. 1 involves three steps: a preparing step, a course ADC step, and a fine ADC step.

During the preparing step, the control signal generator circuit 50 generates the first control signal S0 to have a logic high pulse, while the second and third control signals S1 and S2 are kept logic low. With the second control signal S1 logic low, the fourth control signal SH is also logic low.

Figure 3:
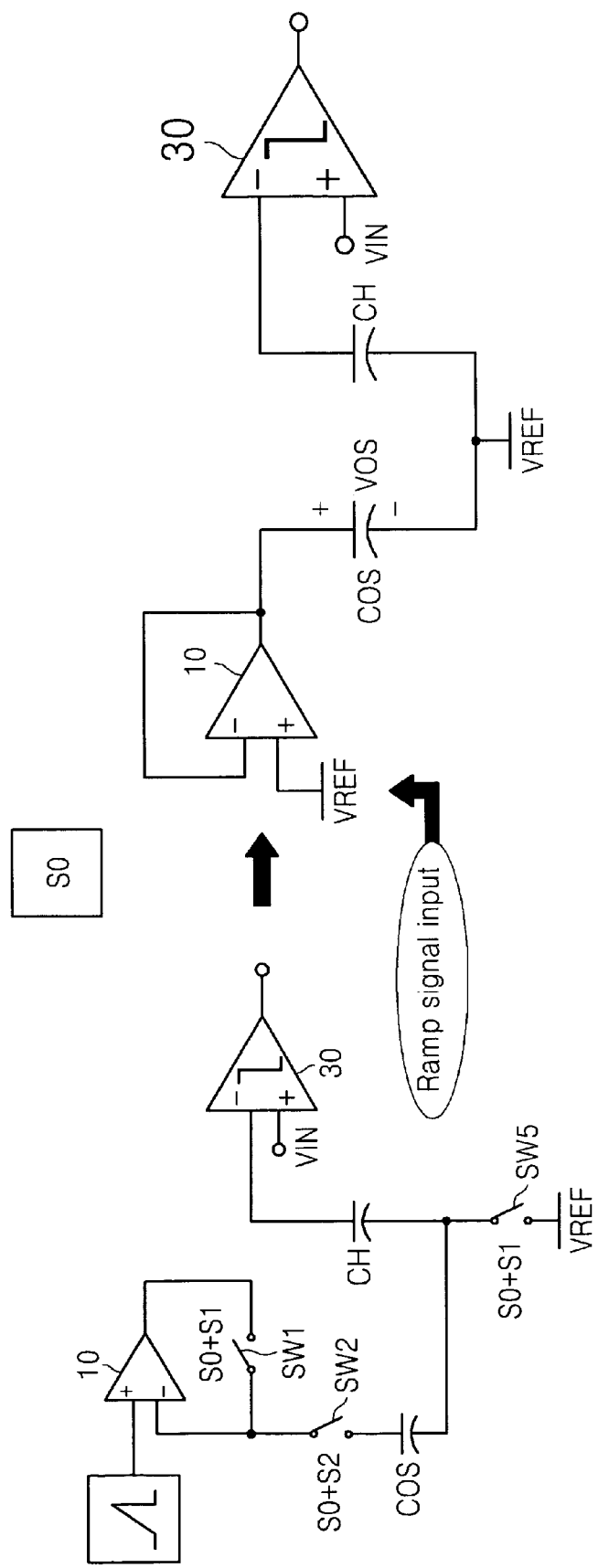
FIGS. 3-5 illustrate circuit configuration achieved by the ADC of FIG. 1 during different operating steps.

As a result, the first switch SW1 closes, the second switch SW2 closes, the third switch SW3 opens, the fourth switch SW4 is opens and the fifth switch SW5 closes. This configures the ADC to achieve the circuit configuration shown in FIG. 3. As shown in FIG. 3, the voltage ramp VRAMP is the same as the reference voltage VREF. Generally, the reference voltage VREF will be ground, but the present invention is not limited to this. With the positive terminal of the first operational amplifier 10 connected to ground, an offset voltage VOS appears at the output of the first operational amplifier 10.

Next, during the first ADC stage called the course ADC step, the control signal generator 50 generates the first control signal S0 to be logic low, the second control signal S1 to be logic high, and maintains the third control signal S2 logic low. The second control signal S1 is logic high, and the output of the second operational amplifier 30 is logic high, with the input signal voltage VIN greater than the negative terminal voltage. Accordingly, the fourth control signal SH also becomes logic high. This results in the ADC obtaining the circuit configuration shown in FIG. 4.

Figure 4:
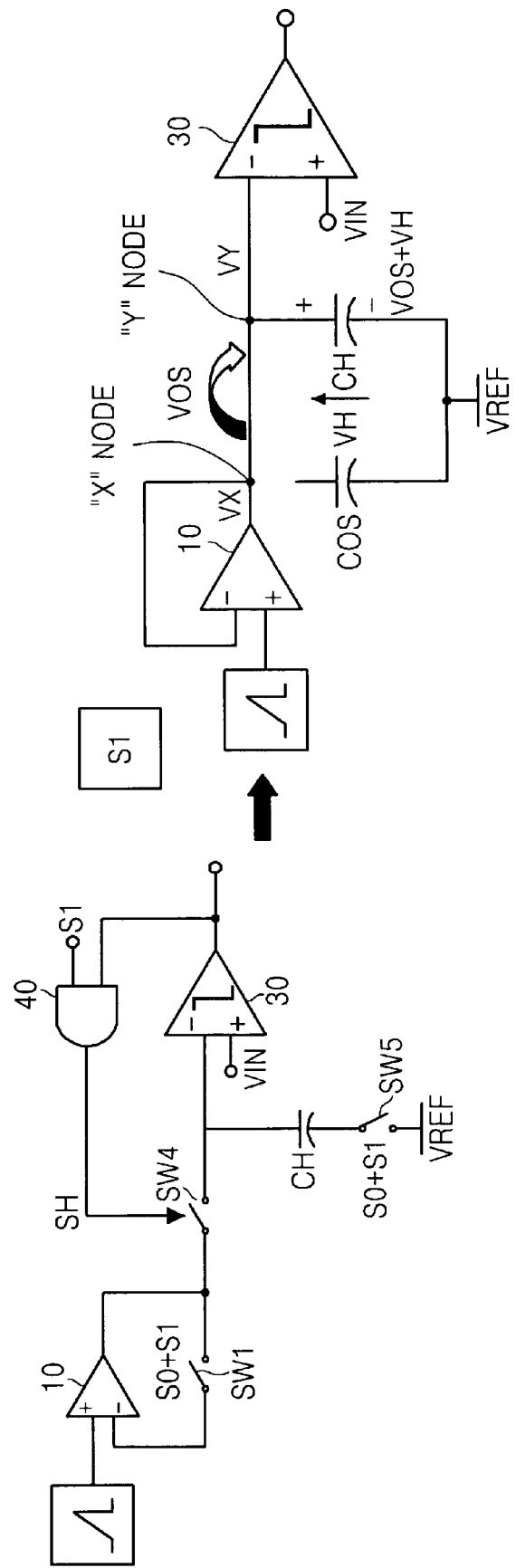

As discussed with respect to FIG. 3, the output of the first operational amplifier 10, which is represented as node X in FIG. 4, obtained a voltage of VOS during the preparing step. Accordingly, the voltage at node X, represented by VX in FIG. 4 is equal to VOS. Assuming an initial voltage VH of the capacitor CH, the reference voltage VY at the negative input terminal of the second operational amplifier 30, which is represented by node Y in FIG. 4, is initially VH. Namely, the reference voltage VY of the node Y is VH. However, at the beginning of the course ADC step, node X becomes connected to node Y such that the reference voltage VY at node Y becomes VOS+VH.

As shown in FIG. 2, during the course ADC step, the ramp voltage VRAMP is increased from the reference voltage in a linear fashion; namely, a relatively steeply increasing voltage representing most significant bits (i.e., upper bits) of a digital code is supplied. While the ramp signal is illustrated as straight line, it will be appreciated that in actuality, the ramp signal VRAMP has a stair step structure. The step height representing the different between subsequent most significant bits.

The reference voltage VY at node Y is VY=VRAMP+ VOS+VH. When the voltage VY at node Y increases to a point exceeding the input voltage VIN, as a result of the increase in the ramp voltage, the output of the second operational amplifier 30 transitions to logic low such that the fourth control signal SH transitions to logic low. This causes the fourth switch SW4 to open. The transition of the output from the second operational amplifier 30 to logic low indicates to latch the digital code associated with the ramp signal voltage prior to that causing the transition as the upper bits of the ADC output. Also, the reference voltage VY will be stored in the capacitor CH. In one embodiment, the output of the second operational amplifier 30 may be supplied to the control signal generating circuit 50, which include a register for latching the digital code representing the upper bits.

Next, the second ADC stage called the fine ADC step takes place with the control signal generator 50 generating the first control signal S0 to be logic low, the second control signal S1 to be logic low and the third control signal S2 to be logic high. Because the second control signal S1 is logic low, the fourth control signal SH will also be logic low. As a result, the first switch SW1 is open, the second switch SW2 is closed, the third switch SW3 is closed, the fourth switch SW4 is open, and the fifth switch SW5 is open. This results in the ADC having the circuit configuration shown in FIG. 5. Furthermore, the control signal generating circuit 50 generates the ramp signal VRAMP as shown in FIG. 2. As shown, the slope of this fine ADC ramp signal is much less than the slope of the course ADC ramp signal. This gradually increasing voltage represents the least significant bits of the digital code. Again, it will be appreciated the in actuality the ramp signal VRAMP has a stair step structure with the step height representing the difference between subsequent least significant bits.

Figure 5:
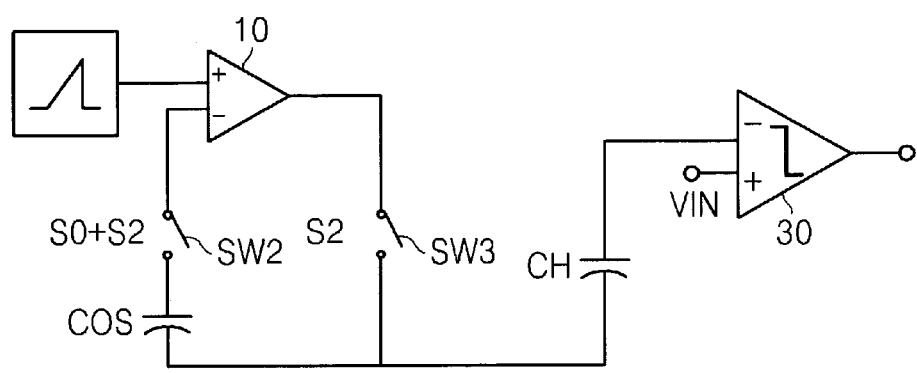
Figure 5:
Figure 5:
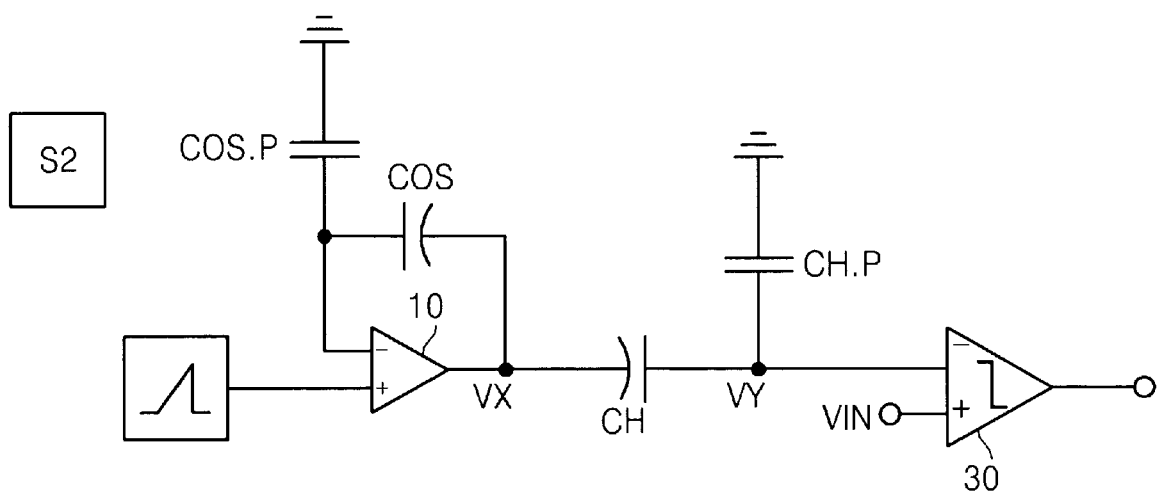

As discussed above, the reference voltage VY=VRAMP+VOS+VH during the course ADC step. During this fine ADC step, as shown in FIG. 5, parasitic capacitance affects the reference voltage VY at node Y. In particular, If we let $$\frac{COS.P}{COS} = a_1, \frac{CH.P}{CH} = a_2 \quad (1)$$

$$VX = (1 + a_1)VRAMP + VOS - VOS \quad (2)$$
$$= (1 + a_1)VRAMP$$

$$VY = (1/(1 + a_2))VX + VC$$
$$= \frac{1}{1 + a_2}(1 + a_1)VRAMP + (VH + VOS)$$

$$= \frac{1 + a_1}{1 + a_2}VRAMP + (VH + VOS) \quad (3)$$

If CH=COS, $a_2=a_1$, then $$a_1 = (1 + e)a_2 \quad (4)$$

$$VY = \frac{1 + (1 + e)a}{1 + a}VRAMP + VH + VOS \quad (5)$$

$$VY = (1 + ae)VRAMP + VH + VOS \quad (6)$$

Because the "ae" term is very small, the delivery ratio of the ramp voltage VRAMP to the node Y during the course and fine ADC steps is essentially the same. Namely, for the course ADC step:

$$VY=R1(VRAMP)+VOS+VH \quad (7)$$

where R1 is the delivery ratio of the ramp voltage VRAMP during the course ADC step. From the discussion above, it is readily apparent that R1=1.

For the fine ADC step:

$$VY=R2(VRAMP)+VOS+VH \quad (8)$$

where R2 is the delivery ratio of the ramp voltage VRAMP during the course ADC step. From the discussion above, it is readily apparent that R2=(1+ae), which is essentially 1.

Therefore, the delivery ratios of the course and fine ADC steps are essentially the same, which provides for a more linear response of the ADC. As such, the first operational amplifier 10, the first switch SW1, the second switch SW2, the first capacitor COS, and the third switch SW3 may be thought of as a delivery ratio compensating circuit.

FIG. 2 illustrates the voltage VX and VY during the fine ADC step. As VX increases, VY increases in a like manner. When the reference voltage VY exceeds the input voltage VIN, the second operation amplifier 30 transitions to logic low. This indicates to latch the digital code associated with the current ramp signal voltage as the lower bits of the ADC output. In one embodiment, the output of the second operational amplifier 30 may be supplied to the control signal generating circuit 50, which includes a register for latching the digital code representing the lower bits. The control signal generating circuit 50 may then output the completed digital code from the register as the ADC output.

Second Embodiment

Figure 6:
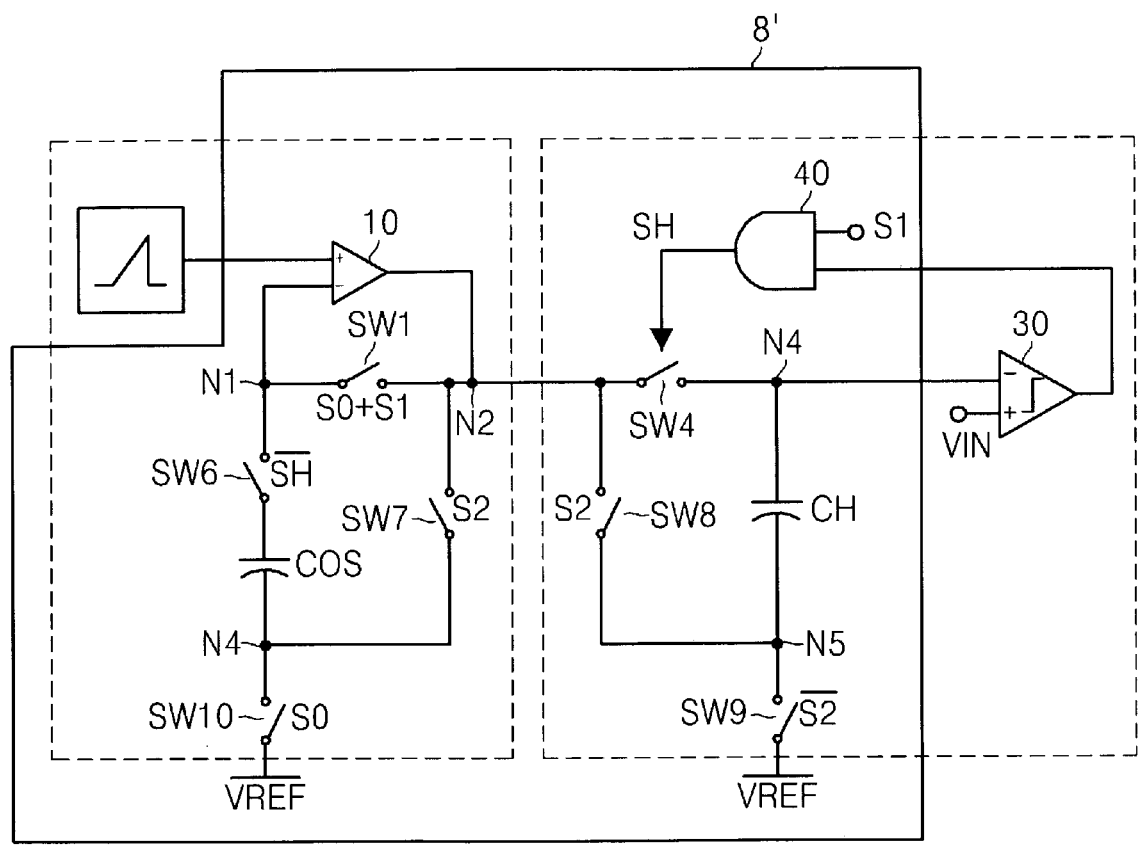
FIG. 6 illustrates an embodiment of an analog-to-digital converter (ADC) according to an embodiment of the present invention.
Figure 6:
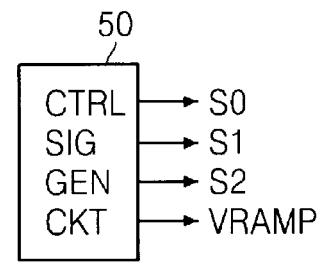

FIG. 6 illustrates an analog-to-digital converter (ADC) according to another embodiment of the present invention. As shown, the ADC includes a supply circuit 8'. The supply circuit 8' supplies a reference voltage VY to a negative input terminal of an operational amplifier 30. The operational amplifier 30 compares this reference voltage VY to the voltage VIN of an input signal supplied to the positive input terminal.

The supply circuit 8' includes a first differential amplifier 10, first, fourth, and sixth-tenth switches SW1, SW4, SW6-SW10 and first and second capacitors COS and CH, and NAND gate 40. The first differential amplifier 10 receives the ramp voltage VRAMP at the positive terminal, and the negative terminal is connected to the first node N1. The output of the first differential amplifier 10 is supplied to the second node N2. The first node N1 and the second node N2 are selectively connected by the first switch SW1. The first switch SW1 opens or closes based on the first control signal S0 and the second control signal S1. In particular, if either or both of the first and second control signals S0 and S1 are logic high then the first switch SW1 is closed. If both of the first and second control signals S0 and S1 are logic low then the first switch SW1 is open.

A sixth switch SW6 and the first capacitor COS are connected in series between the first node N1 and a fourth node N4. The sixth switch SW6 is controlled by the inverse of the fourth control signal /SH. In particular, the sixth switch SW6 is closed if the inverse of the fourth control signal /SH is logic high. If the inverse of the fourth control signal /SH is logic low, then the sixth switch SW6 is open.

The second node N2 is connected to the fourth node N4 by a seventh switch SW7. The seventh switch SW7 is controlled by the third control signal S2. In particular, if the third control signal S2 is logic high, the seventh switch SW7 is closed. If the third control signal S2 is logic low, then the seventh switch SW7 is open. A tenth switch SW10 is connected between the fourth node N4 and the reference voltage VREF. The tenth switch is controlled by the first control signal S0. In particular, if the first control signal S0 is logic high then the tenth switch SW10 is closed. If the first control signal S0 is logic low then the tenth switch SW10 is open.

The second node N2 is connected to a fifth node N5 by an eighth switch SW8. The eighth switch SW8 is controlled by the third control signal S2. In particular, if the third control signal S2 is logic high, the eighth switch SW8 is closed. If the third control signal S2 is logic low, then the eighth switch SW8 is open.

The second node N2 is also connected to a negative terminal of a second operational amplifier 30 by the fourth switch SW4. The fourth switch SW4 is controlled by a fourth control signal SH. If the fourth control signal SH is logic high, then the fourth switch SW4 is closed, and if the fourth control signal SH is logic low, then the fourth switch SW4 is open. A second capacitor CH is connected between the negative input terminal and the fifth node N5. A ninth switch SW9 is connected between the fifth node N5 and the reference voltage VREF. The ninth switch SW9 is controlled by an inverse of the third control signal /S2. In particular, if the inverse of the third control signal /S2 is logic high, the ninth switch SW9 is closed. If the inverse of the third control signal /S2 is logic low, the ninth switch SW9 is open.

An input signal IN having an input signal voltage VIN is supplied to the positive terminal of the second operational amplifier 30. The output of the second operational amplifier 30 provides the output of the ADC. This output is also connected to one of the two input terminals of an AND gate 40. The AND gate 40 receives the second control signal S1 at its other input. The output of the AND gate is the fourth control signal SH.

The first differential amplifier 10, the first switch SW1, the second switch SW2, the sixth switch SW6, the seventh switch SW7 and the first capacitor COS form a supply circuit 20, the operation of which will be described in greater detail below.

As further shown in FIG. 6, the control signal generating circuit 50 generates the first control signal S0, the second control signal S1, the third control signal S2 and the ramp signal VRAMP. The control signal generating circuit 50 generates the controls signals in the same manner as discussed above with respect to FIG. 1. Namely, FIG. 2 illustrates the first, the second, and the third control signals S0, S1 and S2 and the ramp signal VRAMP generated by the control signal generating circuit 50 for both the embodiments of FIGS. 1 and 6. FIG. 2 also shows the fourth control signal SH and an example input signal voltage VIN for both the embodiments of FIGS. 1 and 6.

Figure 7:
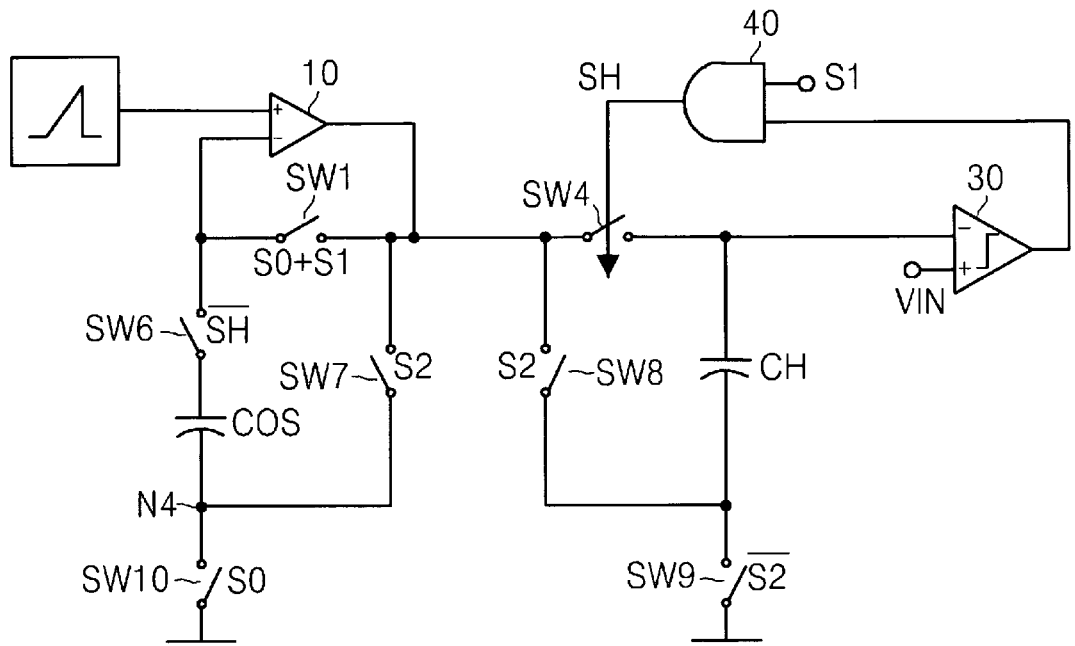
FIGS. 7-9 illustrate circuit configuration achieved by the ADC of FIG. 6 during different operating steps.
Figure 7:
Figure 7:
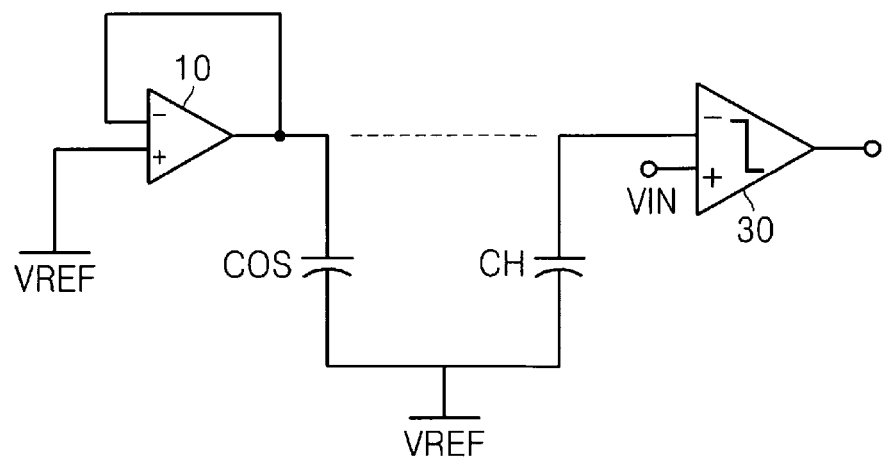

The operation of the ADC illustrated in FIG. 6 will now be described with reference to FIG. 2. During the preparing step, the control signal generator circuit 50 generates the first control signal S0 to have a logic high pulse, while the second and third control signals S1 and S2 are kept logic low. With the second control signal S1 logic low, the fourth control signal SH is logic low. As a result of the above, the first switch SW1 closes, the fourth switch SW4 is open, the sixth switch is closed, the seventh and eighth switches SW7 and SW8 are open, and the ninth and tenth switches SW9 and SW10 are closed. This configures the ADC to achieve the circuit configuration shown in FIG. 7. As shown, the circuit configuration of FIG. 7 is the same as the circuit configuration of FIG. 3, and the operation is the same as described above with respect to FIG. 3.

Figure 8:
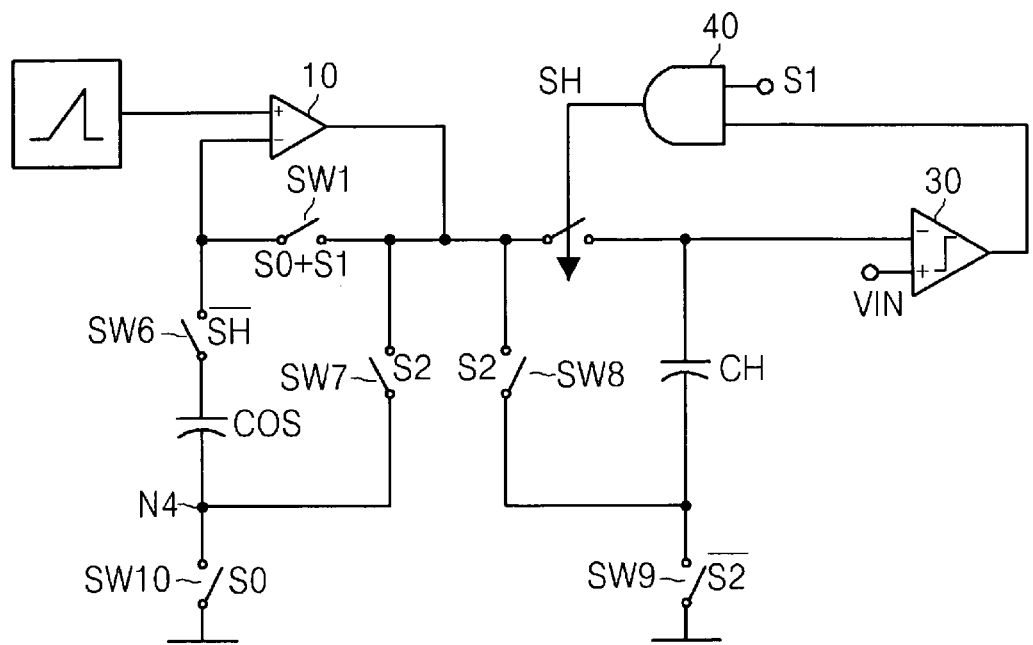
Figure 8:
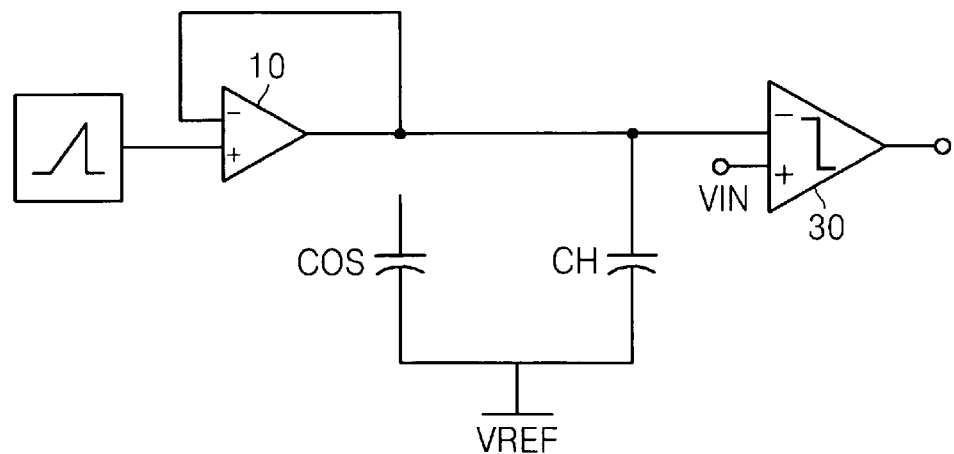

Next, during the course ADC step, the control signal generator 50 generates the first control signal S0 to be logic low, the second control signal S1 to be logic high, and maintains the third control signal S2 logic low. The second control signal S1 is logic high, and the output of the second operational amplifier 30 is logic high, with the input signal voltage VIN greater than the negative terminal voltage. Accordingly, the fourth control signal SH also becomes logic high. Accordingly, the first switch SW1 is closed, the fourth switch SW4 is closed, the sixth switch SW6 is open, the seventh and eighth switches SW7 and SW8 are open, and the ninth switch SW9 is closed and the tenth switch SW10 is open. This results in the ADC obtaining the circuit configuration shown in FIG. 8. As shown, the circuit configuration of FIG. 8 is the same as the circuit configuration of FIG. 4, and the operation is the same as described above with respect to FIG. 4.

Figure 9:
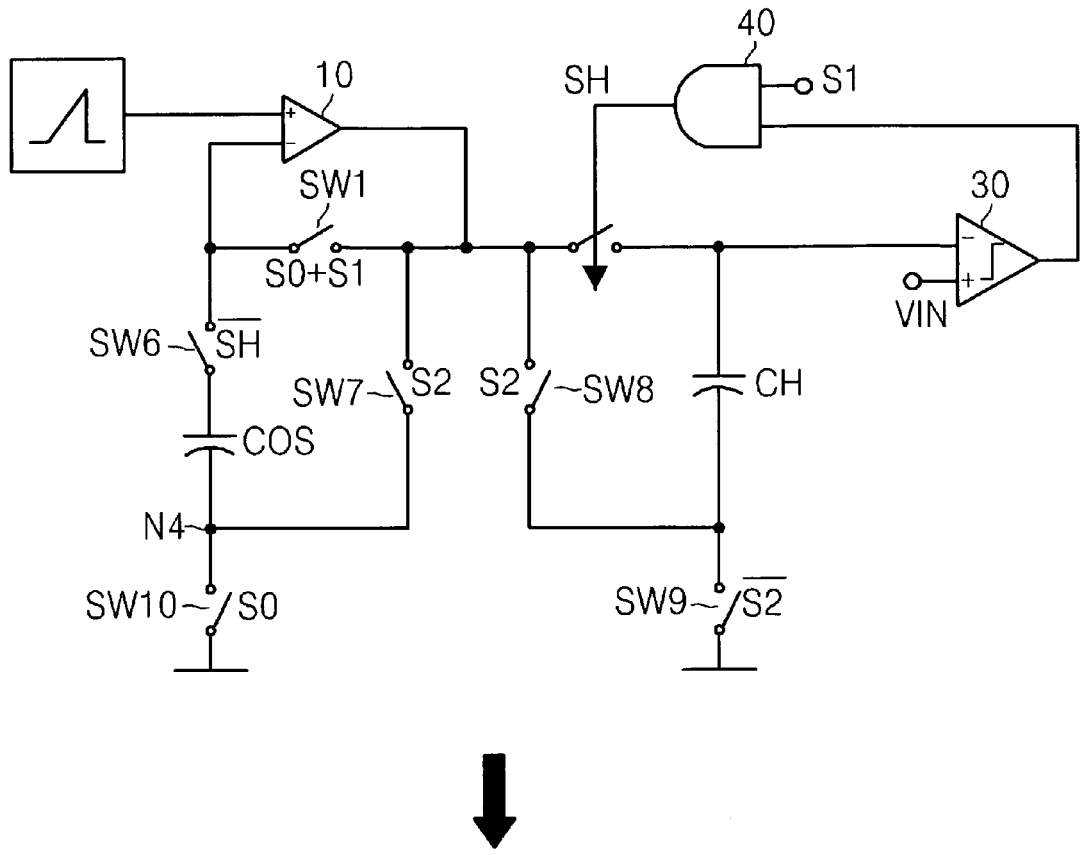
Figure 9:
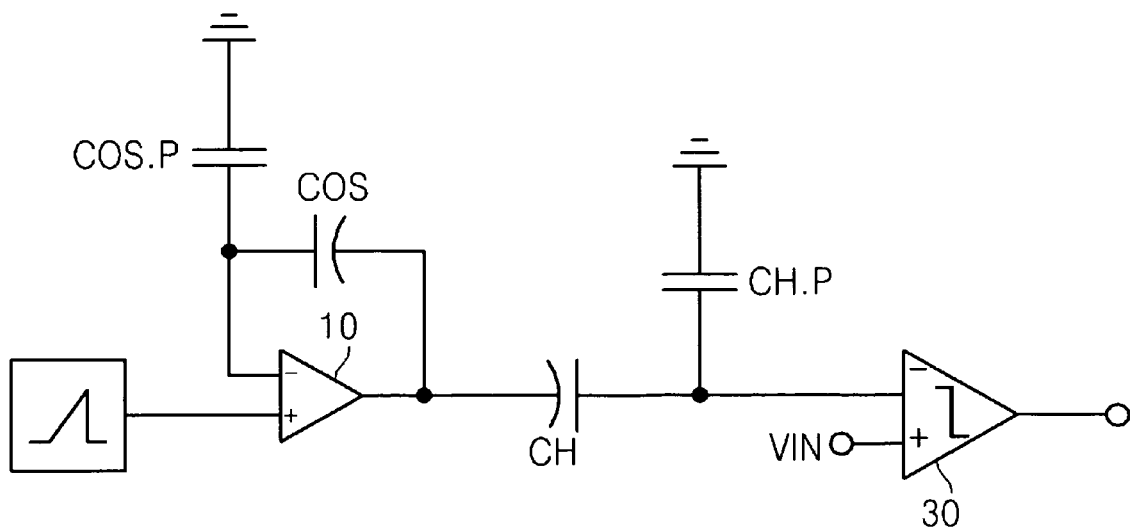

Next, the fine ADC step takes place with the control signal generator 50 generating the first control signal S0 to be logic low, the second control signal S1 to be logic low and the third control signal S2 to be logic high. Because the second control signal S1 is logic low, the fourth control signal SH will also be logic low. Accordingly, the first switch SW1 is open, the fourth switch SW4 is open, the sixth switch SW6 is closed, the seventh and eighth switches SW7 and SW8 are closed, and the ninth switch SW9 is open and the tenth switch SW10 is open. This results in the ADC obtaining the circuit configuration shown in FIG. 9. As shown, the circuit configuration of FIG. 9 is the same as the circuit configuration of FIG. 5, and the operation is the same as described above with respect to FIG. 5.

As demonstrated above, the embodiment of FIG. 6 achieves the same circuit configurations and operates in the same manner as the embodiment of FIG. 1. Therefore, the delivery ratios of the course and fine ADC steps are essentially the same in the embodiment of FIG. 6, which provides for a more linear response of the ADC. As such, the first operational amplifier 10, the first switch SW1, the sixth switch SW6, the first capacitor COS, the seventh switch SW7 and the tenth switch SW10 may be thought of as a delivery ratio compensating circuit or a supply circuit. Also, the control signal generating circuit 50, as described above with respect to FIG. 1, may be triggered to latch the digital codes representing the upper and lower bits, and output the completed code as the ADC output.

Third Embodiment

Figure 10:
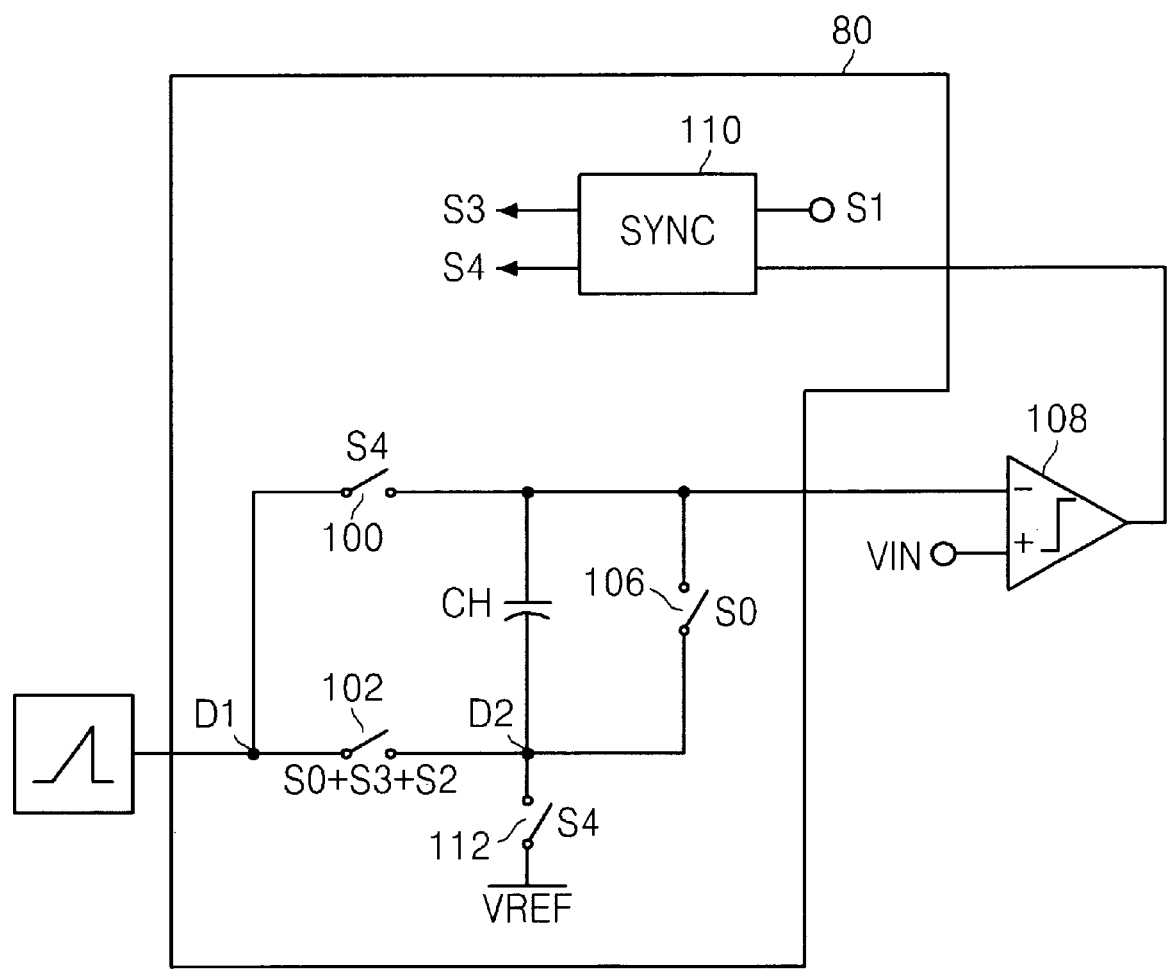
FIG. 10 illustrates an embodiment of an analog-to-digital converter (ADC) according to an embodiment of the present invention.
Figure 10:
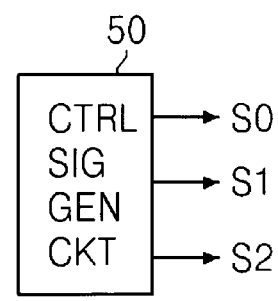

FIG. 10 illustrates an ADC according to a further embodiment of the present invention. As shown, in the ADC in this embodiment, the supply circuit 80 is controlled by first, second, third, fourth and fifth control signals S0-S4. In the supply circuit 80, a first switch 100 is connected between a first node D1 and the negative terminal of an operational amplifier 108. The first switch 100 receives the ramp signal VRAMP at the first node D1, and is controlled by a fifth control signal S4. In particular, when the fifth control signal S4 is logic high, the first switch 100 is closed; and when the fifth control signals S4 is logic low, the first switch 100 is open. A second switch 102 is connected between the first node D1 and a second node D2, and receives the ramp signal VRAMP at the first node D1. The second switch 102 is controlled by the first, third and fourth control signals. In particular, if any of the first, third and fourth control signals S0, S2 and S3 are logic high, the second switch 102 is closed, and if all of the first, third and fourth control signals S0, S2 and S3 are logic low, the second switch 102 is open.

The capacitor CH is connected between the second node D2 and the negative terminal of the operation amplifier 108, and a third switch 106 is connected between the second node D2 and the negative terminal of the operation amplifier 108. The third switch 106 is controlled by the first control signal S0. In particular, when the first control signal S0 is logic high, the third switch 106 is closed; and when the first control signals S0 is logic low, the third switch 106 is open. A fourth switch 112 is connected between the second node D2 and a reference voltage VREF. The reference voltage VREF may be ground. The fourth switch 112 is controlled by the fifth control signal S4. In particular, when the fifth control signal S4 is logic high, the fourth switch 112 is closed; and when the fifth control signals S4 is logic low, the fourth switch 112 is open.

An input signal IN having an input signal voltage VIN is supplied to the positive terminal of the operational amplifier 108. The output of the operational amplifier 108 provides the output of the ADC. The output of the operational amplifier 108 will be logic high of the input signal VIN at the positive terminal is greater than the voltage at the negative terminal. However, when the voltage at the negative terminal exceeds the input signal voltage VIN, the output of the operation amplifier 108 becomes logic low. This output is also connected to one of two input terminals of a sync circuit 110. The other input terminal receives the second control signal S1.

The sync circuit 110 generates the fourth and fifth controls signals S3 and S4 based on the output of the operation amplifier 108 and the second control signal S1. In particular, if output of the operation amplifier is logic high and the second control signal is logic high, the sync circuit 110 generates a logic high fourth control signal S4; otherwise, the sync circuit 110 generates a logic low fourth control signal S4. Also, when the second control signal S1 is logic high and the operation amplifier 108 output transitions to logic low, the sync circuit 110 generates a logic high pulse as the fifth control signal S4; otherwise the fifth control signal S4 is logic low. This operation will be described in more detail below.

Figure 11:
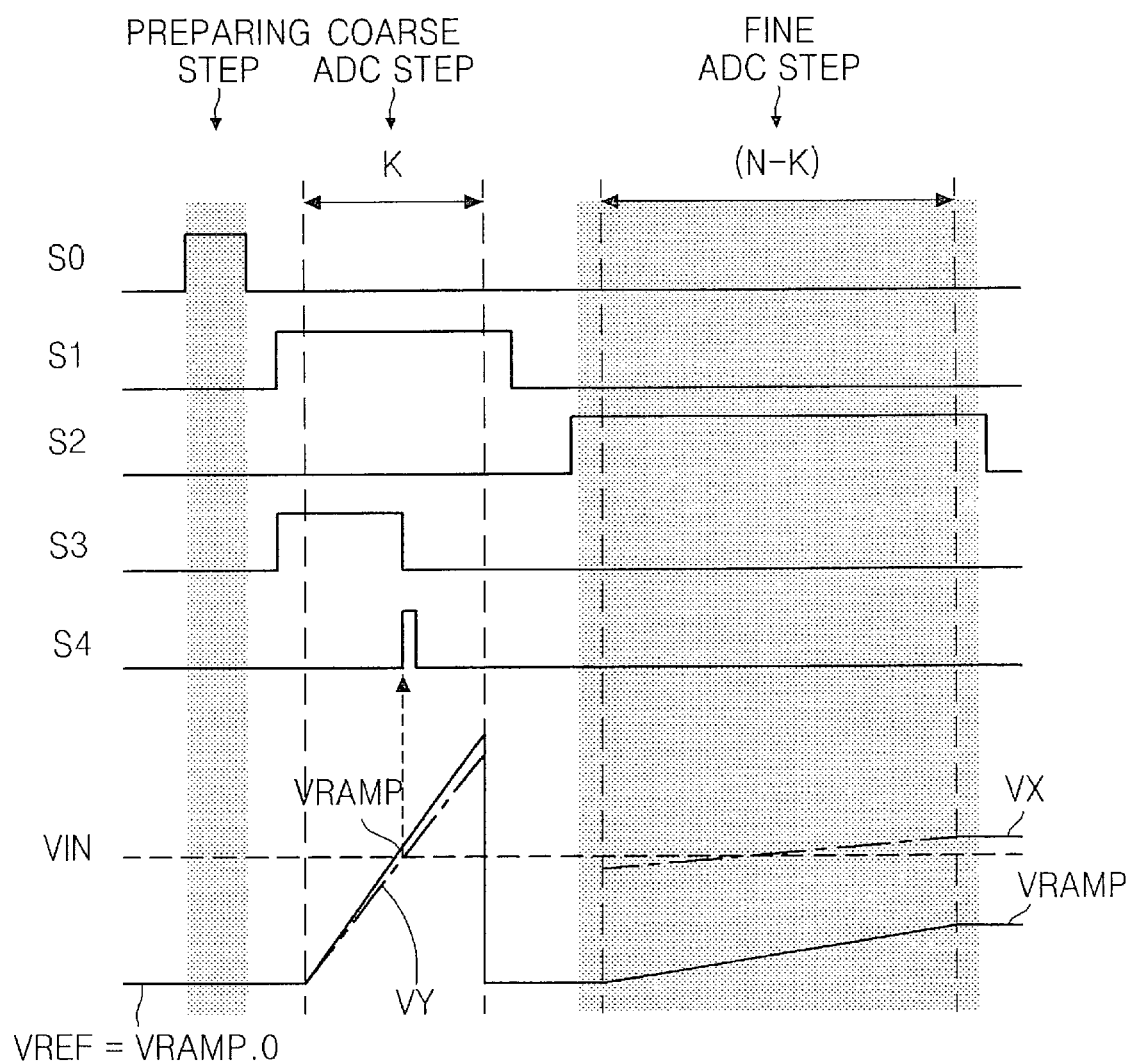
FIG. 11 illustrates waveforms of signals generated during operation of the ADC illustrated in FIG. 10.

As further shown in FIG. 10, the ADC includes the control signal generating circuit 50, which generates the first control signal S0, the second control signal S1, the third control signal S2 and the ramp signal VRAMP in the same manner as described above with respect to FIG. 2. FIG. 11 illustrates the first, the second, and the third control signals S0, S1 and S2 and the ramp signal VRAMP generated by the control signal generating circuit 50. In particular, FIG. 11 illustrates the timing with which the control signal generating circuit 50 generates the first, second and third control signals S0, S1 and S2 and the ramp signal VRAMP. As shown, this is the same as illustrated in FIG. 2.

FIG. 11 also shows the fourth and fifth controls signals S3 and S4 and an example input signal voltage VIN. These voltages and their timings will be described in greater detail below with respect to the operation of the ADC illustrated in FIG. 10. As illustrated in FIG. 11, operation of the ADC illustrated in FIG. 10 involves the three steps of FIG. 2: a preparing step, a course ADC step, and a fine ADC step.

During the preparing step, the control signal generator circuit 50 generates the first control signal S0 to have a logic high pulse, while the second and third control signals S1 and S2 are kept logic low. Because the second control signal 51 is logic low, the fourth and fifth controls signals S3 and S4 are also logic low.

Figure 12:
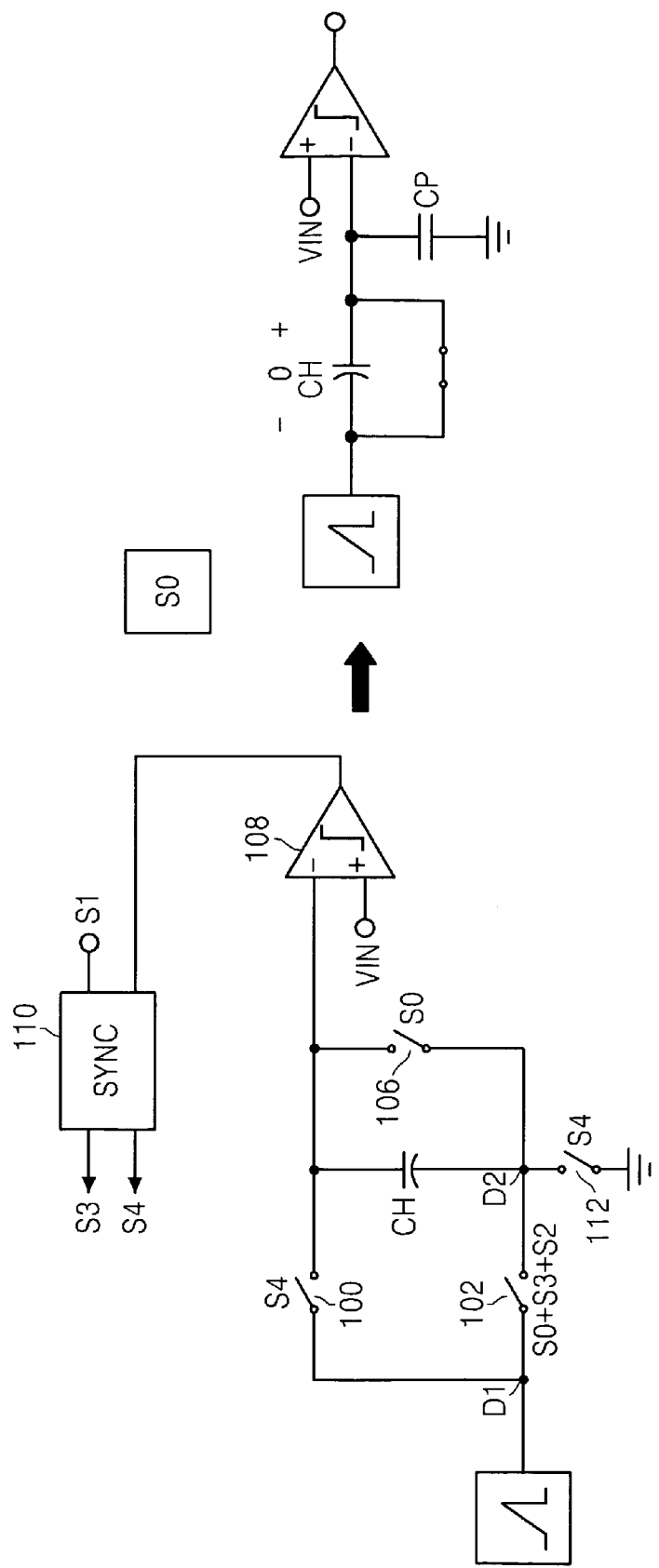
FIGS. 12-15 illustrate circuit configuration achieved by the ADC of FIG. 1 during different operating steps.

As a result, the first switch 100 is open, the second switch 102 is closed, the third switch S106 is closed, and the fourth switch 112 is open. This configures the ADC to achieve the circuit configuration shown in FIG. 12. As shown in FIG. 12, the ramp voltage VRAMP is the reference voltage VREF, which is zero in this example. The ramp voltage VRAMP is supplied directly to the negative terminal of the operation amplifier 108. FIG. 12 also shows a parasitic capacitor CP.

Next, during the course ADC step, the control signal generator 50 generates the first control signal S0 to be logic low, the second control signal S1 to be logic high, and maintains the third control signal S2 logic low. Because the ramp voltage is less than the input signal voltage VIN at when the second control signal S1 become logic high, the sync circuit 110 generates a logic high fourth control signal S3 and a logic low fifth control signal S4. As a result, the first switch 100 is open, the second switch 102 is closed, the third switch 106 is open, and the fourth switch 112 is open. This results in the ADC obtaining the circuit configuration shown in FIG. 13. Accordingly, the course ADC stage beings and the ramp voltage VRAMP is supplied to the negative input terminal of the operational amplifier 108 via the capacitor CH. The voltage at the negative input terminal, reference voltage VY, is equal to:

$$VY=(CH/(CH+CP))*VRAMP. \quad (9)$$

Figure 14:
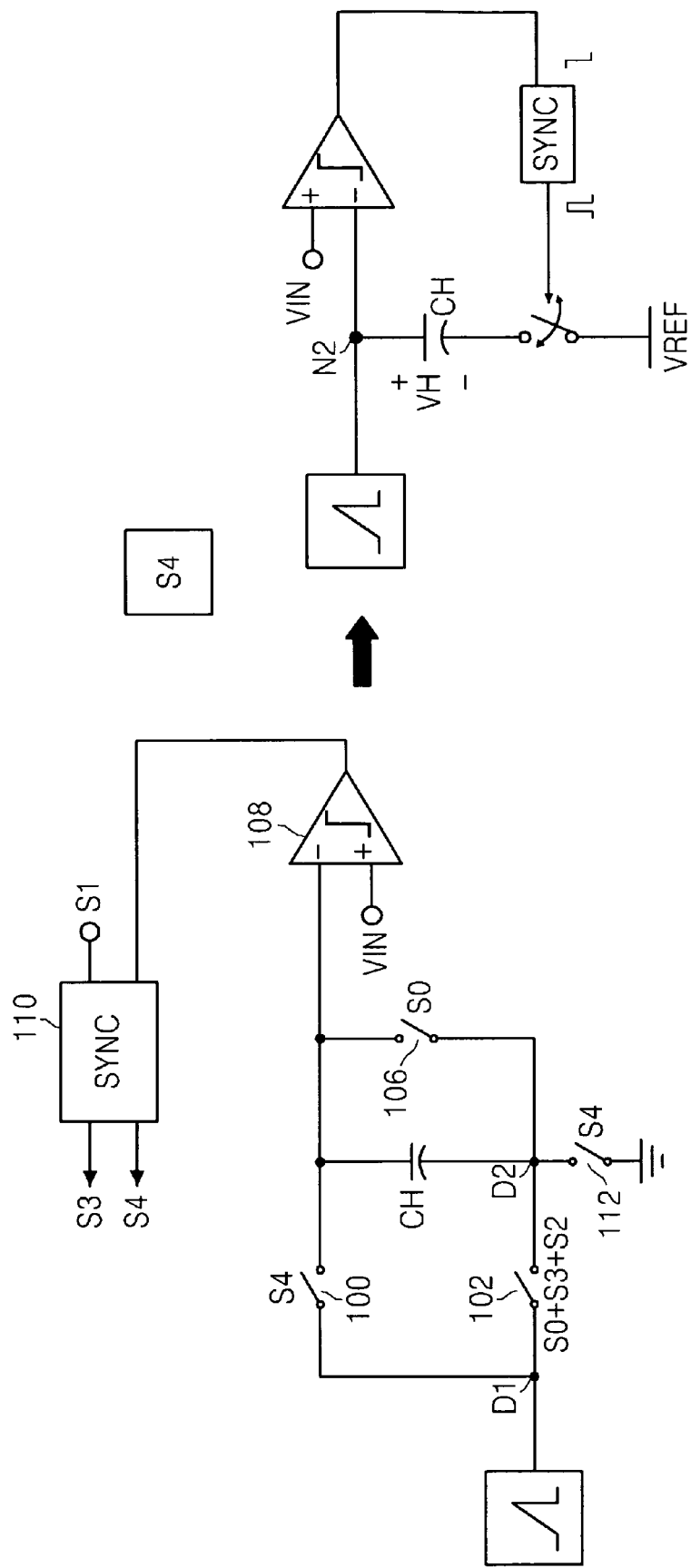

As shown in FIG. 11, during the course ADC step, the ramp voltage VRAMP is increased as described above with respect to FIG. 2. When the reference voltage VY at the negative input terminal of the operational amplifier 108 increases to a point exceeding the input voltage VIN, the output of the operational amplifier 108 transitions to logic low such that the sync circuit 110 transitions the fourth control signal S3 to logic low, and generates a logic high pulse as the fifth control signal. This causes the first switch 100 to close for a short time, the second switch 102 to open and the fourth switch 112 to close for short time. The third switch 106 remains open. The ADC circuit thus obtains the configuration shown in FIG. 14. With this configuration, a charge storage stage begins in which the capacitor CH stores the reference voltage VY during the period of time that the first and fourth switches 100 and 112 closed. Also, the digital code associated with the ramp voltage prior to voltage causing the operation amplifier to transition may be stored or latched as the most significant bits. As with the embodiment of FIG. 1, this may take place at the control signal generating circuit 50.

Figure 15:
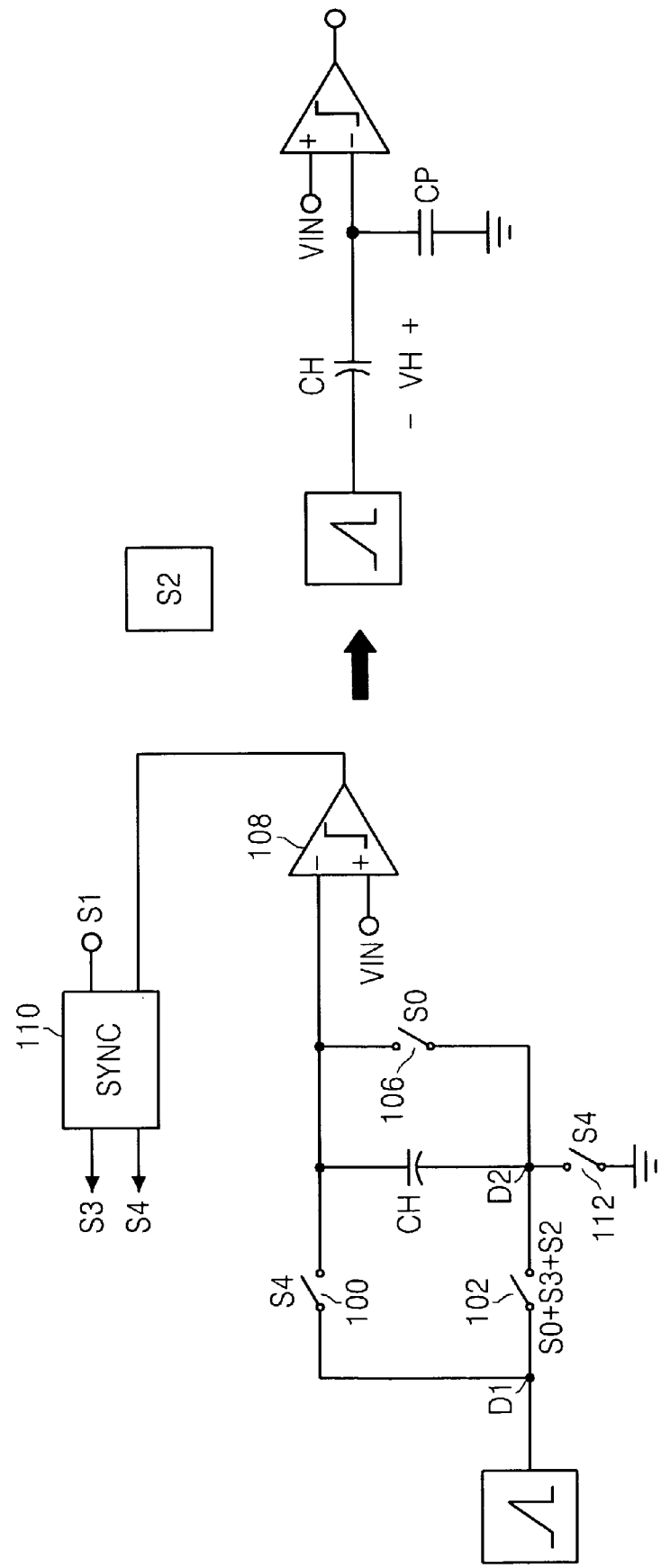

After the charge storage stage, the second ADC stage (the fine ADC step) takes place with the control signal generator 50 generating the first control signal S0 to be logic low, the second control signal S1 to be logic low and the third control signal S2 to be logic high. Because the second control signal S1 is logic low, the fourth and fifth control signals S3 and S4 will also be logic low. As a result, the first switch 100 is open, the second switch 102 is closed, the third switch 106 is open, and the fourth switch 112 is open. This results in the ADC having the circuit configuration shown in FIG. 15.

Figure 13:
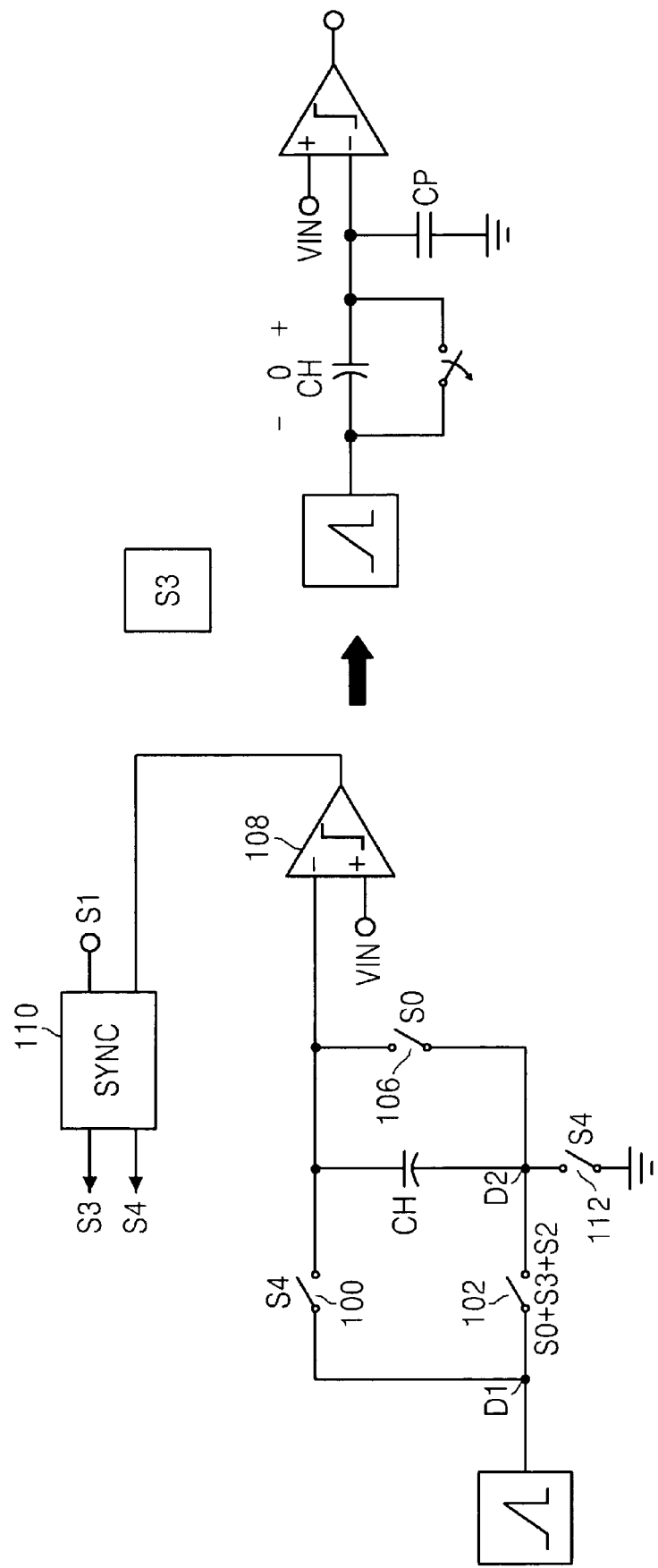

As will be appreciated this configuration is the same as in FIG. 13 such that The voltage at the negative input terminal, reference voltage VY, is equal to:

$$VY=(CH/(CH+CP))*VRAMP. \quad (10)$$

This is the same as during the course ADC step. Therefore, the delivery ratios of the course and fine ADC steps are essentially the same, which provides for a more linear response of the ADC. Also, the digital code associated with the ramp voltage causing the operation amplifier to transition may be stored or latched as the least significant bits. As with the embodiment of FIG. 1, this may take place at the control signal generating circuit 50.

Figure 16:
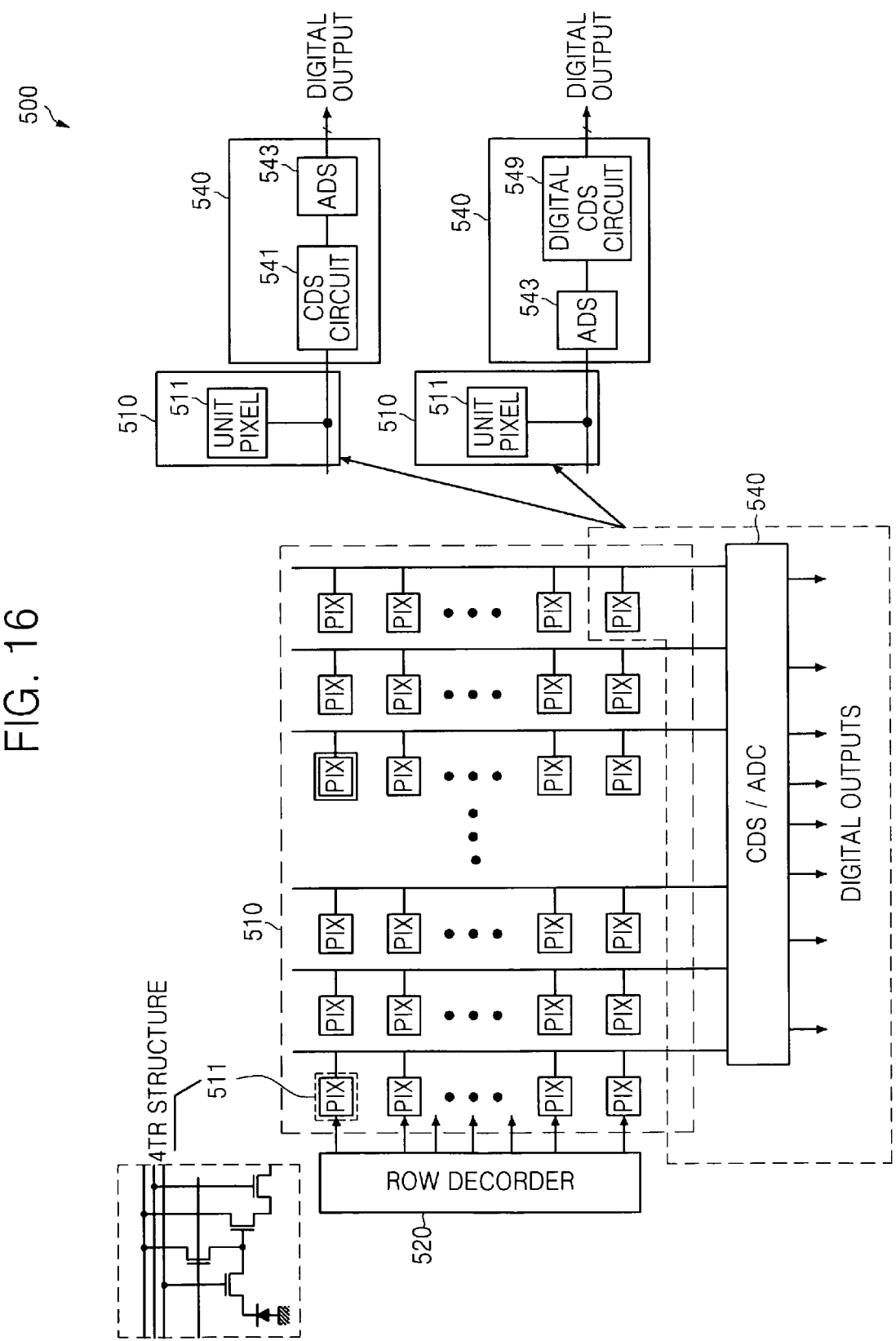
FIG. 16 illustrates a C-MOS image sensor according to an embodiment.

FIG. 16 illustrates a C-MOS image sensor according to an embodiment. As shown, the C-MOS image sensor includes a pixel array 510. The pixel array 510 includes unit pixels 511 arranged in rows and columns. Each of the unit pixels 511 may have the well-known 4 transistor (4TR) structure shown in FIG. 16. A row decoder 520 selectively enables rows of unit pixels 511 to output. A correlated double sampling (CDS)/analog-to-digital converter (ADC) 540 receives the output from the unit pixels 511 in a selected row and generates digital outputs based thereon. In one embodiment, the CDS/ADC 540 includes a CDS circuit and an ADC circuit for each column of unit pixels 511. As shown in FIG. 16, in one embodiment a CDS circuit 541 will first process the output of a unit pixel 511 and the ADC circuit 543 may operate on the output of the CDS circuit 541. As alternatively shown in FIG. 16, instead the ADC circuit 543 may operate on the output of the unit pixel 511, and then a digital CDS circuit 549 may operate on the output of the ADC 543. The ADC 543 may be any of the ADC embodiments described above.

Figure 17:
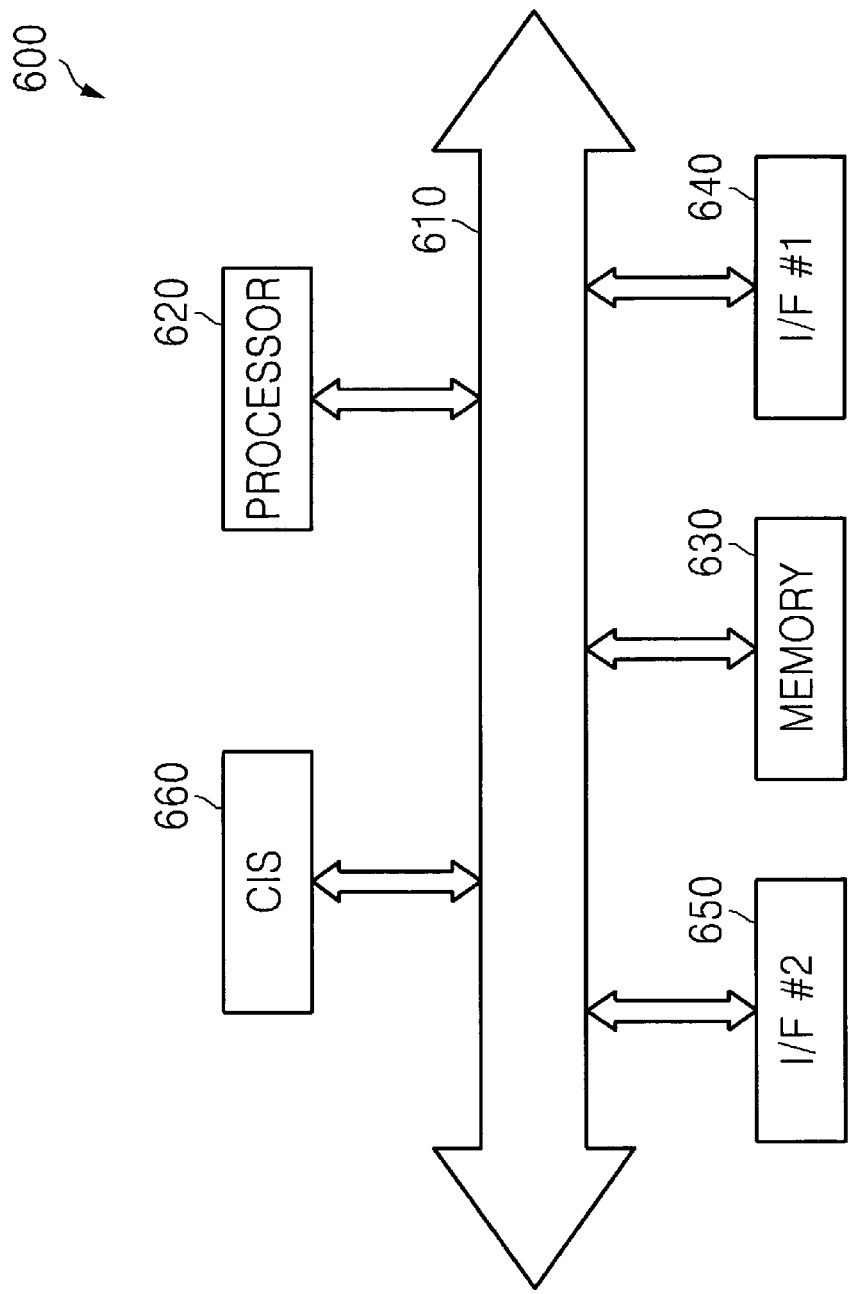
FIG. 17 illustrates an image processing system according to an embodiment.

FIG. 17 illustrates an image processing system according to an embodiment. As shown, a processor 620, a memory 630, a first interface 640, a second interface 650 and a C-MOS image sensor (CIS) 660 are connected to a common bus 610. The processor 620 controls the operation of the memory 630 and the CIS 660 based on input signals received from a user via the first and second interfaces 640 and 650. For example, the first and second interfaces 640 and 650 may be buttons, toggles, etc. forming part of the image processing system.

The memory 630 may be any well-known type of memory such as optical disc, flash memory, hard drive, etc. The CIS 660 may be the CIS described with respect to FIG. 16. However, the CIS may be any well known CIS that incorporates an ADC according, to an embodiment of the present invention.

The invention being thus described, it will be obvious that the same may be varied in many ways. Such variations are not to be regarded as a departure from the invention, and all such modifications are intended to be included within the scope of the invention.

What is claimed is:

1. An analog-to-digital converter, comprising:
 a comparator configured to compare an input signal to a reference signal; and
 a supply circuit configured to supply the reference signal, and configured to provide different circuit configurations for supplying the reference signal during different stages of analog-to-digital conversion such that the reference signal is scaled in substantially a same manner during at least two of the stages.

2. The ADC of claim 1, wherein the supply circuit is configured to provide the different circuit configurations based on output from the comparator.

3. The ADC of claim 2, further comprising:
 a control signal generator generating a plurality of control signals; and wherein
 the supply circuit is configured to provide the different circuit configurations based on the output from the comparator and the plurality of control signals.

4. The ADC of claim 1, further comprising:
 a control signal generator generating a plurality of control signals; and wherein
 the supply circuit is configured to provide the different circuit configurations based on the plurality of control signals.

5. The ADC of claim 1, wherein
 the supply circuit receives a first ramp signal having a first slope during a first stage, has a first circuit configuration during the first stage, and the first circuit configuration generates a first reference signal as the reference signal based on the first ramp signal; and
 the supply circuit receives a second ramp signal having a second slope during a second stage, has a second circuit configuration during the second stage, and the second circuit configuration generates a second reference signal as the reference signal based on the second ramp signal, the first slope being greater than the second slope.

6. The ADC of claim 5, wherein
 the second circuit configuration includes a capacitor not included in the first configuration; and
 the supply circuit has a third circuit configuration preceding the first stage, and the first stage precedes the second stage, and the third circuit configuration generating a boost voltage to boost the first reference signal by an amount corresponding to an influence of the capacitor on the second reference signal.

7. The ADC of claim 6, wherein the first and second circuit configurations scale the ramp signal by substantially a same amount in generating the first and second reference signals, respectively.

8. The ADC of claim 6, wherein
 the first circuit configuration includes,
  an operational amplifier having an output connected to a negative input terminal thereof, and a positive input terminal configured to receive the first ramp signal, the output of the operation amplifier connected to a first input of the comparator, and
  a first capacitor connected between the first input of the comparator and a fixed voltage;
 the second circuit configuration includes,
  the operational amplifier has the positive input terminal configured to receive the second ramp signal,
  a second capacitor connected between the negative input terminal and the output of the operation amplifier,
  the first capacitor connected between the output of the operational amplifier and the first input of the comparator; and
 the third circuit configuration includes,
  the operational amplifier having the output connected to the negative input terminal thereof, and the positive input terminal configured to receive the fixed voltage,
  the second connected between the output of the operational amplifier and the fixed voltage, and
  the first capacitor connected between the comparator and the fixed voltage.

9. The ADC of claim 5, wherein
 the first circuit configuration includes,
  an operational amplifier having an output connected to a negative input terminal thereof, and a positive input terminal configured to receive the first ramp signal, the output of the operation amplifier connected to a first input of the comparator, and
  a first capacitor connected between the first input of the comparator and a fixed voltage; and
 the second circuit configuration includes,
  the operational amplifier has the positive input terminal configured to receive the second ramp signal,
  a second capacitor connected between the negative input terminal and the output of the operation amplifier,
  the first capacitor connected between the output of the operational amplifier and the first input of the comparator.

10. The ADC of claim 5, wherein the supply circuit is configured to store the first reference signal based on output from the comparator prior to the second stage.

11. The ADC of claim 10, wherein the supply circuit is configured to achieve at least a third circuit configuration to store the first reference signals based on output from the comparator prior to the second stage.

12. The ADC of claim 11, wherein the first and second circuit configurations are a same circuit configuration, and the third circuit configuration differs from the first and second circuit configurations.

13. The ADC of claim 1, wherein the supply circuit comprises:
 an operational amplifier having a positive input terminal, a negative input terminal and an output;
 a first switch connected between the negative input terminal and the output of the operational amplifier, the first switch selectively closed based on at least one of a first and second control signal;
 a second switch and a first capacitor connected in series between the negative input terminal and a first node, the second switch selectively closed based on at least one of the first control signal and a third control signal;
 a third switch connected between the output of the operational amplifier and the first node, the third switch selectively closed based on the third control signal;
 a fourth switch connected between the output of the operational amplifier and a first input of the comparator, the fourth switch selectively closed based on a fourth control signal;
 a second capacitor connected between the first input of the comparator and the first node;

a fifth switch connected between the first node and a reference voltage, the fifth switch selectively closed based on at least one of the first and second control signals; and a logic circuit configured to generate the fourth control signal based on the second control signal and output from the comparator.

14. The ADC of claim 13, wherein
the logic circuit is a NAND gate; and
the comparator is a second operational amplifier, the first input is the negative input terminal of the second operational amplifier, and the positive input terminal of the second operational amplifier is configured to receive the input signal.

15. The ADC of claim 13, further comprising:
a control signal generator configured to generate the first, second and third control signals.

16. The ADC of claim 15, wherein the control signal generator is configured to generate a logic high first control signal and logic low second and third control signals during a preparing step, is configured to generate a logic high second control signal and logic low first and third control signals during a coarse ADC step, and is configured to generate a logic high third control signal and logic low first and second control signals during a fine ADC step.

17. The ADC of claim 1, wherein the supply circuit comprises:
an operational amplifier having a positive input terminal, a negative input terminal and an output;
a first switch connected between the negative input terminal and the output of the operational amplifier, the first switch selectively closed based on at least one of a first and second control signal;
a second switch connected between the output of the operational amplifier and a first node, the second switch selectively closed based on a third control signal;
a third switch and a first capacitor connected in series between the negative input terminal and the first node, the third switch selectively closed based on a fourth control signal;
a fourth switch connected between the first node and a reference voltage, the fourth switch selectively closed based on the first control signal;
a fifth switch connected between the output of the operational amplifier and a first input of the comparator, the fifth switch selectively closed based on the fourth control signal;
a second capacitor connected between the first input of the comparator and a second node;
sixth switch connected between the output of the operational amplifier and the second node, the sixth switch selectively closed based on the third control signal;
a seventh switch connected between the second node and the reference voltage, the seventh switch selectively closed based on the third control signal; and
a logic circuit configured to generate the fourth control signal based on the second control signal and output from the comparator.

18. The ADC of claim 17, wherein
the logic circuit is a NAND gate; and
the comparator is a second operational amplifier, the first input is the negative input terminal of the second operational amplifier, and the positive input terminal of the second operational amplifier is configured to receive the input signal.

19. The ADC of claim 17, further comprising:
a control signal generator configured to generate the first, second and third control signals.

20. The ADC of claim 19, wherein the control signal generator is configured to generate a logic high first control signal and logic low second and third control signals during a preparing step, is configured to generate a logic high second control signal and logic low first and third control signals during a coarse ADC step, and is configured to generate a logic high third control signal and logic low first and second control signals during a fine ADC step.

21. The ADC of claim 1, wherein the supply circuit comprises:
a first switch connected between a first node and a second node, the first switch selectively closed based on at least one of first, second and third control signals;
a second switch connected between the first node and a first input of the comparator, the second switch selectively closed based on a fourth control signal;
a capacitor connected between the second node and the first input of the comparator;
a third switch connected between the second node and the first input of the comparator, the third switch selectively closed based on the first control signal;
a fourth switch connected between the second node and a reference voltage, the fourth switch selectively closed based on the fourth control signal; and
a logic circuit configured to generate the third and fourth control signals based on a fifth control signal and output from the comparator.

22. The ADC of claim 21, wherein
the logic is configured to generate a logic high third control signal if the output of the comparator is logic high and the fifth control signal is logic high, and is configured to generate a logic high pulse for the fourth control signal if the fifth control signal is logic high and the output of the comparator transitions to logic low; and
the comparator is a second operational amplifier, the first input is the negative input terminal of the second operational amplifier, and the positive input terminal of the second operational amplifier is configured to receive the input signal.

23. The ADC of claim 21, further comprising:
a control signal generator configured to generate the first, second and third control signals.

24. The ADC of claim 23, wherein the control signal generator is configured to generate a logic high first control signal and logic low second and third control signals during a preparing step, is configured to generate a logic high second control signal and logic low first and third control signals during a coarse ADC step, and is configured to generate a logic high third control signal and logic low first and second control signals during a fine ADC step.

25. An analog-to-digital converter (ADC), comprising:
a comparator configured to compare an input signal to a reference signal; and
a supply circuit configured to supply the reference signal based on a first ramp signal having a first slope during a first ADC stage and configured to supply the reference signal based on a second ramp signal having a second slope during a second ADC stage, and the supply circuit adjusting the first and second slopes of the first and second ramp signals, respectively, in supplying the first and second reference signals, and the adjustment to the first and second slopes being by a substantially same ratio.

26. An apparatus, comprising:
an analog-to-digital converter (ADC) configured to perform a conversion process that includes at least a first step and a second step, the first step being performed based on a first ramp signal having a first slope, and the second step being performed based on a second ramp signal having a second slope; and
a compensating circuit compensating the ADC to reduce a difference between a first ratio by which the first slope is adjusted and a second ratio by which the second slope is adjusted.

27. An image sensor, comprising:
a pixel unit array;
a row decoder configured to selectively enabling output of a row of pixel units in the pixel unit array; and
a processing circuit configured to process output from each pixel unit in the enabled row of pixel units, the processing circuit including,
an analog-to-digital converter (ADC), the ADC including,
a comparator configured to compare an input signal to a reference signal, and
a supply circuit configured to supply the reference signal, and configured to provide different circuit configurations for supplying the reference signal during different stages of analog-to-digital conversion such that the reference signal is scaled in substantially a same manner during at least two of the stages.

28. The image sensor of claim 27, wherein the processing circuit comprises:
a correlated double sample (CDS) circuit associated with each analog-to-digital converter, the CDS configured to perform a CDS operation on output from a unit pixel, and supply output to the associated ADC.

29. The image sensor of claim 27, wherein the processing circuit comprises:
a correlated double sample (CDS) circuit associated with each analog-to-digital converter, the CDS configured to perform a CDS operation on output from the associated ADC.

30. An image processing system, comprising:
a memory;
an image sensor;
at least one interface; and
a processor, the processor configured to control at least one of the image sensor and the memory based on input from the interface; and wherein
the image sensor includes,
a pixel unit array;
a row decoder configured to selectively enabling output of a row of pixel units in the pixel unit array;
a processing circuit configured to process output from each pixel unit in the enabled row of pixel units, the processing circuit including,
an analog-to-digital converter (ADC), the ADC including,
a comparator configured to compare an input signal to a reference signal, and
a supply circuit configured to supply the reference signal, and configured to provide different circuit configurations for supplying the reference signal during different stages of analog-to-digital conversion such that the reference signal is scaled in substantially a same manner during at least two of the stages.

* * * * *